United States Patent
Holmes et al.

[11] Patent Number: 6,137,128
[45] Date of Patent: Oct. 24, 2000

[54] SELF-ISOLATED AND SELF-ALIGNED 4F-SQUARE VERTICAL FET-TRENCH DRAM CELLS

[75] Inventors: Steven John Holmes, Milton; Howard Leo Kalter, Colchester, both of Vt.; Sandip Tiwari, Ossining, N.Y.; Jeffrey John Welser, Stamford, Conn.

[73] Assignee: International Business Machines Corporation, Armonk, N.Y.

[21] Appl. No.: 09/094,383

[22] Filed: Jun. 9, 1998

[51] Int. Cl.[7] .................. H01L 27/108; H01L 29/76; H01L 29/94; H01L 31/119; H01L 21/8242

[52] U.S. Cl. .................. 257/301; 257/302; 257/296; 438/243

[58] Field of Search .................. 257/296, 301, 257/302, 906, 908; 438/242, 243, 427

[56] References Cited

U.S. PATENT DOCUMENTS

| | | |
|---|---|---|
| 4,774,556 | 9/1988 | Fujii et al. . |
| 4,964,080 | 10/1990 | Tzeng . |
| 5,001,078 | 3/1991 | Wada ............................ 437/52 |
| 5,017,977 | 5/1991 | Richardson . |
| 5,071,782 | 12/1991 | Mori . |
| 5,078,498 | 1/1992 | Kadakia et al. . |
| 5,146,426 | 9/1992 | Mukherjee et al. . |
| 5,382,540 | 1/1995 | Sharma et al. . |
| 5,386,132 | 1/1995 | Wong . |
| 5,508,543 | 4/1996 | Hartstein et al. . |
| 5,945,704 | 8/1999 | Schrems et al. .............. 257/301 |

OTHER PUBLICATIONS

Pein, et al. "A 3–D Sidewall Flash EPROM Cell and Memory Array", IEEE Electron Device Letters, vol. 14, No. 8, 1993, pp. 415–417.

Pein, et al. "Performance of the 3–D Penicil Flash EPROM Cell and Memory Array", IEEE Transactions on Electron Devices, vol. 42, No. 11, 1995, pp. 1982–1991.

Primary Examiner—Wael Fahmy
Assistant Examiner—Neal Berezny
Attorney, Agent, or Firm—Scully, Scott, Murphy & Presser; Manny W. Schecter Esq.

[57] ABSTRACT

A densely packed array of vertical semiconductor devices, having pillars, deep trench capacitors, vertical transistors, and methods of making thereof are disclosed. The pillars act as transistor channels, and may be formed utilizing the application of hybrid resist over a block of semiconductor material. Drain doped regions are formed on the top of each pillar. The source doped regions and the plate doped regions are self-aligned and are created by diffusion in the trenches surrounding the pillars. The array has columns of bitlines and rows of wordlines. The capacitors are formed by isolating $n^+$ polysilicon in trenches separating said pillars. The array is suitable for GBit DRAM applications because the deep trench capacitors do not increase array area. The array may have an open bitline architecture, where the plate region is common to all the storage nodes or a folded architecture with two wordlines that pass through each cell having stacked transistors, where one wordline is active and the other is passing for each cell.

12 Claims, 12 Drawing Sheets

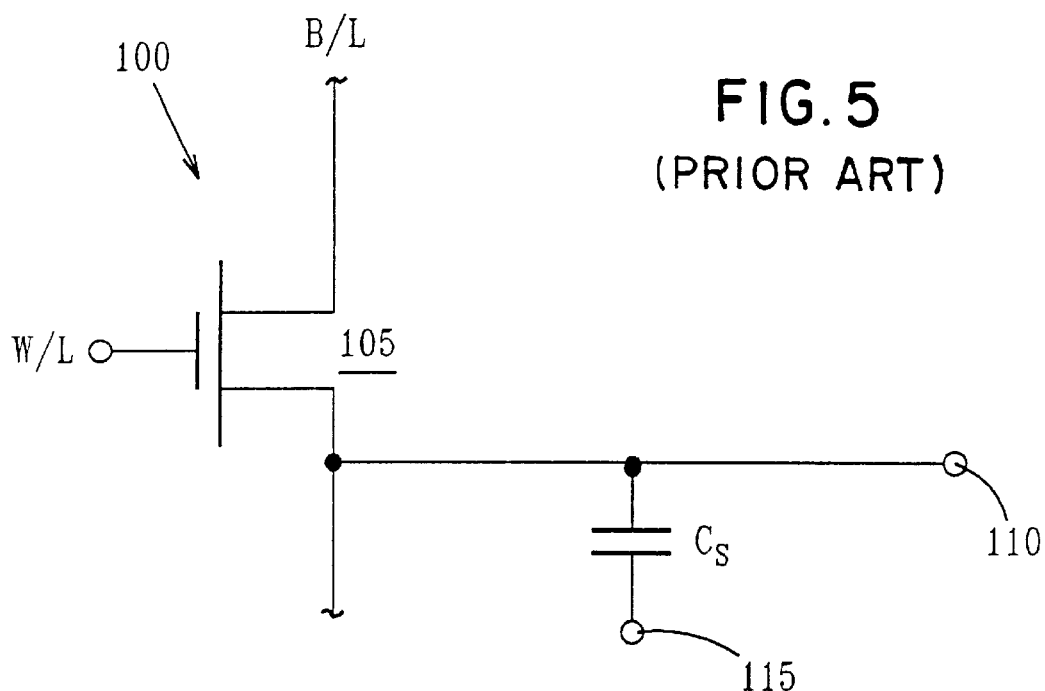
FIG. 5
(PRIOR ART)
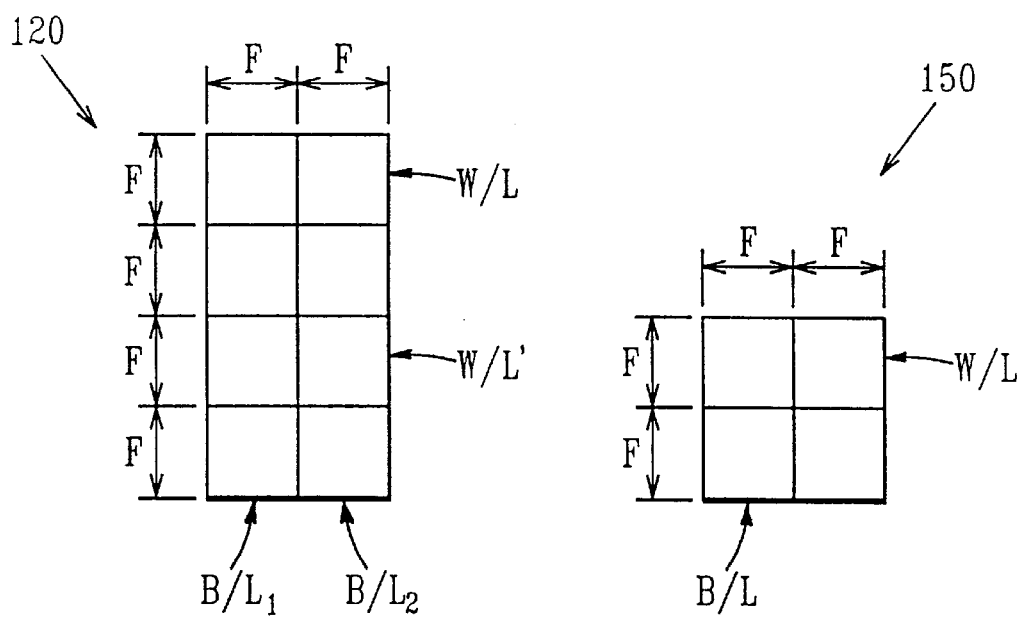
FIG. 6
(PRIOR ART)
FIG. 7
(PRIOR ART)

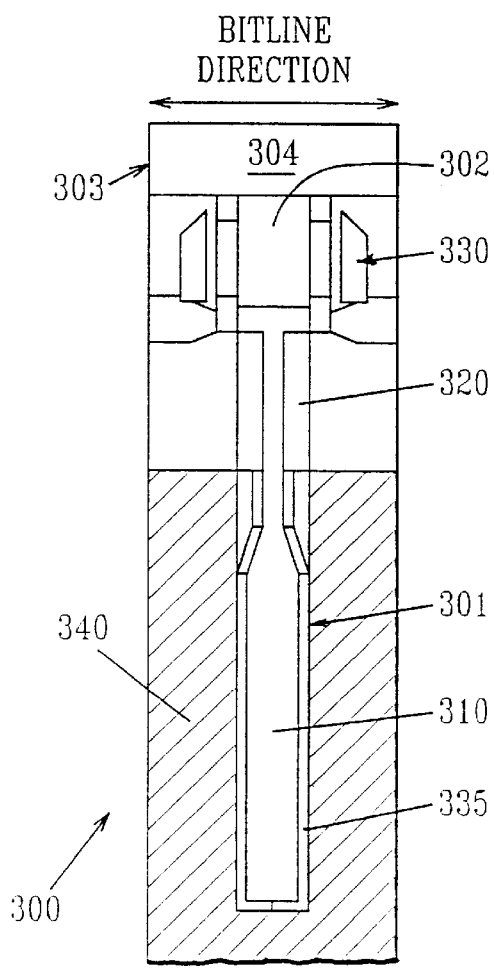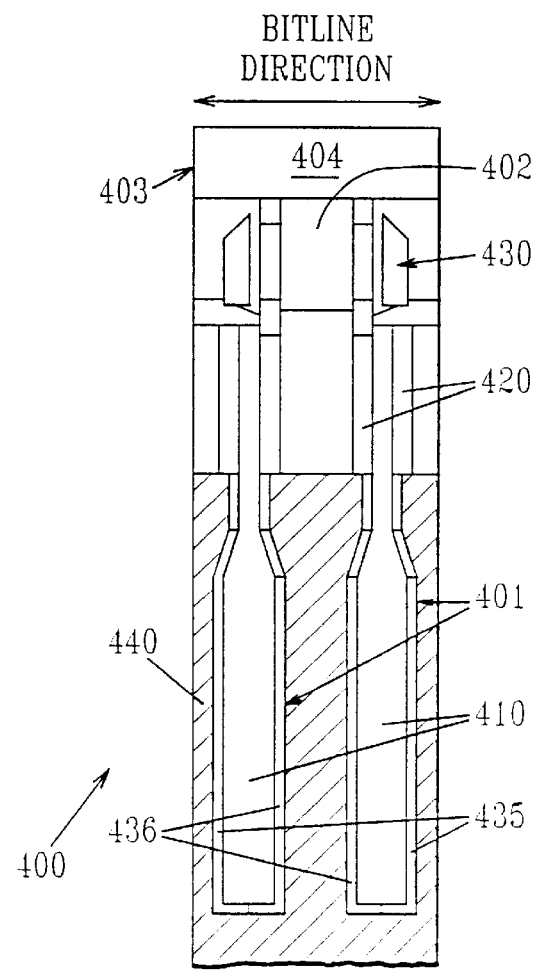

SELF-ISOLATED AND SELF-ALIGNED 4F-SQUARE VERTICAL FET-TRENCH DRAM CELLS

The following patent applications are assigned to the assignee hereof and contain subject matter related to the subject matter of the present patent application:

1. U.S. patent application Ser. No. 08/787,419, entitled "4 F-Square Memory Cell Having Vertical Floating-Gate Transistors with Self-Aligned Shallow Trench Isolation," filed on even date herewith for Jeffrey J. WELSER, Hussein I. HANAFI, Stuart M. BURNS, and Waldemar W. KOCON;

2. U.S. patent application Ser. No. 08/792,955, entitled "Self-Aligned Diffused Source Vertical Transistors with Stack Capacitors in a 4 F-Square Memory Cell Array," filed on even date herewith for Jeffrey J. WELSER, Hussein I. HANAFI, Stuart M. BURNS, Waldemar W. KOCON, and Howard L. KALTER;

3. U.S. patent application Ser. No. 08/792,952, entitled "Self-Aligned Diffused Source Vertical Transistors with Deep Trench Capacitors in a 4 F-Square Memory Cell Array," filed on even date herewith for Jeffrey J. WELSER, Hussein I. HANAFI, Stuart M. BURNS, and Howard L. KALTER;

4. U.S. patent application Ser. No. 08/787,418, entitled "2 F-Square Memory Cell for Gigabit Memory Applications", filed on even date herewith for Jeffrey J. WELSER, Hussein I. HANAFI, and Stuart M. BURNS; and 5. U.S. patent application Ser. No. 08/790,876, entitled "Frequency Doubling Photoresist", filed on even date herewith for Steven Holmes, A. D. Katnani, N. Patel, M. Hakey, P. A. Rabidoux, and D. V. Horak.

The contents of the above-listed patent applications are incorporated herein by reference.

BACKGROUND OF THE INVENTION

1. Field of the Invention

The present invention is directed to densely packed vertical transistors in a 4 F-square memory cell, and methods for making thereof, and more particularly, to memory cells having self aligned sources with deep trench capacitors formed in trenches that separate the vertical transistors.

2. Discussion of the Prior Art

There is much interest to scale down densely packed semiconductor devices on an integrated circuit (IC) chip to reduce size and power consumption of the chip, and allow faster operation. In order to achieve the high packing density necessary for GBit memory applications, it is crucial to shrink the size of an individual memory cell as much as possible. FIG. 1 shows a top view of a conventional array 10 of conventional erasable programmable read only memory (EPROM) devices 15, using vertical transistors, such as metal oxide silicon field effect transistors (MOSFETs) with a floating gate layer. The conventional array 10 is described in the following two references. H. Pein and J. D. Plummer, "A 3-D sidewall flash EPROM call and memory array", Electron Device Letters, Vol. 14 (8) 1993 pp.415–417. H. Pein and J. D. Plummer, "Performance of the 3-D Pencil Flash EPROM Cell and Memory Array", IEEE Translations on Election Devices, Vol. 42, No. 11, 1995, pp. 1982–1991.

The conventional array 10 has rows of wordlines 20 and columns of bitlines 25. The size of a cell 27 of the array 10 is 2 F by 2 F+$\Delta$, leading to a cell area of 4 F$^2$+2 F$\Delta$. F is the minimum line width of the feature size that can be patterned with lithography. 2 F is the cell size along the wordline 20, and 2 F+$\Delta$ is the cell size along the bitline 25. Typically, $\Delta$ is approximately 0.2–0.5 F, resulting in a cell area of approximately 4.4–5.0 F$^2$ area achievable using conventional lithography. The additional length $\Delta$ is necessary to separate adjacent wordlines 20.

FIG. 2 shows a partial perspective view of the array 10 of FIG. 1, and FIG. 3 shows a cross sectional view of the vertical MOSFET 15 along a bitline 25.

As shown in FIG. 3, the MOSFET 15 has an n source 30 formed on a P-doped silicon substrate 35. The source 30 is formed after etching the substrate 35 to form a vertical pillar 40, referred to as the body of the MOSFET 15. The pillar 40 acts as the transistor channel and has dimensions of F by F, as shown in FIGS. 1 and 3.

As a result of forming the source 30 after forming the pillars 40, the source 30 is formed around edges of the pillar 40 and is absent from a region 45 located below the pillar 40. Thus, the source 30 does not entirely occupy the footprint or lower portion of the pillar 40. As shown in FIG. 2, all the MOSFETs 15 of the array 10 have a common source 30, including MOSFETs of different bitlines 25 and different wordlines 20. As shown in FIGS. 2–3, the top of each pillar 40 is doped with N-type material to form n$^+$ drains 50 of the vertical transistors 15.

A tunnel oxide 60 is formed around the pillar 40 and an oxide spacer 65 is formed on the source 30. Next, a polysilicon floating gate 70, gate oxide 75 and polysilicon control gate 20 are formed around the tunnel oxide 60. Note, control gates 20 of individual transistors along the wordline 20 are interconnected to form the wordline 20.

Because the polysilicon control gate 20 grows uniformly around each vertical MOSFET 15, the spacing between MOSFETs 15 of adjacent rows is slightly larger than the feature size F, e.g., F+$\Delta$, where $\Delta$ is approximately 0.2 F. This separates adjacent wordlines 20 by amount $\Delta$, when polysilicon is grown up to a distance of 0.5 F. This 0.5 F thick polysilicon layer covers the top and sidewalls of the pillars 40, as well as the oxide spacer 65 located on the substrate 35 at the base of the pillars 40.

The 0.5 F thick grown polysilicon regions at pillar sidewalls separated by distance F, along each wordline 20, merge with each other. This forms the wordlines 20 around a row of pillars that are separated by F. However, the 0.5 F thick formed polysilicon regions at pillar sidewalls separated by distance F+$\Delta$ do not merge. Rather, they remain separated by the distance $\Delta$. At the base of the trenches located between these polysilicon-covered pillar sidewalls that are separated by F+$\Delta$, the oxide spacer 65 is covered with the 0.5 F thick polysilicon.

To separate adjacent wordlines 20, an anisotropic reactive ion etch (RIE) is performed that removes polysilicon for a thickness of 0.5 F vertically only. The RIE exposes the top of the pillars 40, as well as the oxide spacer 65 at the base of the pillars that are separated by F+$\Delta$, leaving a sidewall of polysilicon on the edge of each pillar. The exposed distance of the oxide spacer 65 is $\Delta$. Thus, the $\Delta$ separation between adjacent wordlines 20 ensures that control gates 20 of adjacent wordlines are not shorted along the direction of the bitlines 25.

As shown in FIGS. 1 and 2, a first level metal forms bitlines 25 which are orthogonal to the wordlines 20. The first level metal connects drains 50 of MOSFETs 15 along a common bitline 25. The area of the cell 27 of FIG. 2, is small because the substrate 35 is used as a common source 30 for all the MOSFETs 15 of the array 10.

FIG. 4 shows a three-dimensional view of another conventional array 90, which is similar to the conventional array 10 of FIG. 2, except for having round pillars 95 instead of square pillars 40 (FIG. 2). As in the array 10 of FIG. 2, the array 90 of FIG. 4 has a common source 30.

The memory function of each cell 27 (FIGS. 1, 2)is achieved by charging or discharging the floating gate region 70. This causes a measurable shift in the threshold voltage of the vertical MOSFET.

However, to make the conventional MOSFETs 15 useful for DRAM applications, the cell must be modified to isolate the source regions 30 between adjacent bitlines 25. Furthermore, to achieve the packing density necessary for GBit memories, the overall cell area must not be increased by these modifications. The cell area must remain approximately 4 F-Square.

One method for achieving source isolation between bitlines 25 is to pattern isolation lines lithographically between the bitlines 25. Isolation is then achieved by either a local oxidation of silicon (LOCOS), recessed-LOCOS, or conventional shallow trench techniques.

However, such an isolation method requires lithography. Therefore inter-device 20 lines must be increased from F to at least 2 F to avoid shorting adjacent control gates, or wordlines 20 along the bitlines. This increases the inter-device spacing along the bitlines 25 from 1.2 F to 2 F. Thus, the overall cell size increases from 4 $F^2$+0.4 F to at least 6 $F^2$. Moreover, lithographic misalignment degrades device behavior. Hence, packing density and/or performance is sacrificed in this scheme.

To increase packing density, instead of forming the vertical MOSFET 15 having the pillar 40, an inverted transistor is formed in a trench etched into the substrate. Such transistor structures are shown in U.S. Pat. No. 5,386,132; 5,071,782; 5,146,426 and 4,774,556. The transistors formed in such trenches may be combined with additional planar devices, as discussed in U.S. Pat. No. 4,964,080; 5,078,498. Other memory cells have transistors with a floating body, as discussed in U.S. Pat. No. 5,382,540. Another conventional memory cell, disclosed in U.S. Pat. No. 5,017,977, does not have separated buried bitlines between transistors. Such conventional cells fail to achieve maximum packing density due to non-self-aligned isolation techniques, or require complex processing methods for fabrication, e.g., selective epitaxial growth, which methods are not suitable for large-scale production.

Instead of using the vertical devices of the memory cell 27 as an EPROM, the vertical transistor 15 without a floating gate, in conjunction with a capacitor, can also be used for DRAM applications. FIG. 5 shows a schematic of a typical DRAM cell 100 having a field effect transistor (FET) 105 and a storage capacitor $C_s$. The gate of the FET 105 acts as the wordline W/L. A bitline B/L is connected to one terminal of the FET 105, which terminal is the source or drain of the DRAM, depending on application. The other DRAM terminal is connected to a storage node 110 of the storage capacitor $C_s$. The other terminal of the storage capacitor $C_s$ is referred to as a plate 115.

When the FET 105 is turned on by an appropriate signal on the wordline W/L, data is transferred between the bitline B/L and the storage node 110. The conventional one transistor, one capacitor cell 100, shown in FIG. 5, has a theoretical minimum area of 8 $F^2$ for a folded bitline, or 4 $F^2$ For open bitline architecture, shown in FIGS. 6 and 7, respectively.

FIG. 6 shows a top view of a conventional folded bitline DRAM cell 120 having active and passing bitlines B/L$_1$, B/L$_2$, respectively, and active and passing wordlines W/L, W/L', respectively. The word and bit lines each have a width F. The bit and word lines are separated from adjacent bit and word lines by a width F. Thus, the area of the folded bitline DRAM cell 120 is 8 $F^2$.

FIG. 7 shows a top view of a conventional open bitline DRAM cell 150, having a bitline B/L and a wordline W/L, each having a length F and being separated from adjacent lines of adjacent cells (not shown) by a length F. Thus, the area of the open bitline DRAM cell 150 is 4 $F^2$.

Due to the need for contact and isolation spacing, in conventional designs that use planar transistors, it is only possible to obtain these minimum cell sizes by creating sub-lithographic features at some level. In addition, if a minimum cell size is to be obtained, it is necessary to reduce the length of the transistor 105 of FIG. 5 as much as possible (down to F). This reduces the gate length. However, shorter gate lengths result in higher leakage currents which cannot be tolerated. Therefore, the voltage on the bitline must be scaled down accordingly. This reduces the charges stored on the storage capacitor $C_s$, thus requiring a larger capacitance to ensure that the stored charge is sensed correctly, for example, to indicate logic 1 or 0.

Increasing the capacitance of the storage capacitor $C_s$ is achieved by either increasing the capacitor area, or decreasing the effective dielectric thickness located between the capacitor plates. Increasing the capacitor area is becoming more difficult to do without also increasing the cell size, and hence defeating the purpose of shortening the gate in the first place.

Further reducing the dielectric thickness is also difficult, since the thickness of many conventional dielectrics has already reached a minimum practical thickness. To further reduce the dielectric thickness, alternative dielectrics with higher dielectric constant have been explored. While such alternate dielectrics contribute to solving the problem of low charge storage resulting from the decreased bitline voltage, further bitline voltage reduction is limited by the maximum achievable dielectric constant. Accordingly, to further reduce the bitline voltage, an alternative to reducing the gate length of the transistor 105 is necessary.

There is also a need for a memory cell having a proper gate length and capacitor, without increasing the lateral area of the cell.

Conventional one GBit and higher density DRAM cells require several major changes in technology to allow continuing improvements in area occupied per bit without sacrificing the yield. Some options are the use of high permitivity material, such as Barium Strontium Titanate, for storage, the use of vertical transistors with direct tunneling of stored charge in a floating gate region (TRAM—Low Voltage Memory by Tiwari, Hartstein, and Tischler U.S. Pat. No. 5,508,543), the use of quantum-effects, or other structures involving use of silicon-on-insulator, vertical transistors, etc.

Major changes in processes, particularly relating to storage of charge, can be significant impediments to fast yield improvement in manufacturing and can even lead to a failure because of the likelihood of unforeseen and unsolvable problems during later stages of product development.

SUMMARY OF THE INVENTION

The object of the present invention is to provide a memory cell array, and a method of making thereof, that eliminate the problems of conventional memory cell arrays.

Another object of the present invention is to provide a 4 F-Square memory cell array that has self-isolated and self-aligned trenches between adjacent pillar of the array, and a method of making thereof.

Yet another object of the present invention is to provide a memory cell having a trench capacitor, such that the stringent requirements on the transistor due to the use of the third dimension are relaxed.

An additional object of the present invention is to provide a memory cell having a proper gate length and capacitor without increasing the cell lateral area.

These and other objects of the inventions are achieved by a semiconductor device and a method of making thereof. The semiconductor device may be a vertical MOSFET semiconductor device. The semiconductor device is fabricated on a semiconductor pillar etched from a substrate which may be a single crystal substrate. An array of these pillars may be formed with self-aligned isolation using mixtures of hybrid resist to form structures that delineate the presence of the edges.

Both open and folded architectures are realized. An open bitline architecture is where each memory cell has exactly one wordline and one bitline. A folded architecture is where two wordlines pass through each cell, and one wordline is active and the other is passing for each cell.

The vertical memory device comprises a heavily-doped drain region on the top of the pillar, a heavily-doped source region around the upper portion of the pillar, a heavily-doped plate region, and a trench capacitor around each pillar. The source and plate regions are formed, for example, by implantation or by out diffusion from either heavily-doped oxide, polysilicon, or other suitable material deposited between pillars in the memory array. The source outdiffusion material may be removed subsequent to annealing. The trench capacitor comprises a conducting material forming a storage electrode, surrounded by an insulating layer. Upper portion of each trench capacitor is lined with dielectric spacers. A transistor is formed over a barrier which is formed over the dielectric and plate electrode layers.

A gate region is implanted or epitaxially formed on the top of the pillar or on the side of the pillar over the trench capacitor. A conductive gate material, e.g., in-situ, heavily doped polysilicon, with or without silicidation, is deposited on the array to connect pillars along each row, or wordline of the array, orthogonal to the bitline direction.

The vertical transistor, e.g., MOSFET, acts as the transfer device, while the trench capacitor acts as the storage node of a one transistor/one capacitor DRAM cell. The following architectures are formed: an open bitline architecture, where the plate electrode is common to all the storage nodes; and a folded architecture with two wordlines that pass through each cell having stack transistors, where one wordline is active and the other is passing for each cell.

A single etch may be used for the open and folded architectures if a square pillar is not required. For forming square pillars, the pillars are formed using a two-step etch process which etches trenches in orthogonal directions. This etch process creates pillars with a more rectangular cross-section, compared with the circular pillars formed by a single-step etching, and allows the height of the pillar to vary on adjacent sides, dependent on the etch depth for each trench.

The pillars in the array may be separated by distances which are slightly different in the bitline versus wordline directions. For example, the pillars are separated by a distance F along the wordline direction, and by a distance $F+\Delta$ along the bitline direction. The additional spacing $\Delta$ allows the gate material to be separated between adjacent wordlines by etching alone, e.g., (RIE), without lithography. If the pillars are equi-spaced in both directions, an additional mask can be used to separate the gate material in other desired directions.

The memory array integrates a vertical transfer device, such as a MOSFET, on top of a deep trench capacitor to form an ultra-small memory cell. This allows forming a dense array of these cells, where each cell has a size of $4F^2$ in an open bitline or a folded architecture using dual wordlines.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings and in which:

FIG. 5 shows a schematic of a conventional DRAM cell;

FIGS. 6 and 7 show top views of conventional folded and open bitline DRAM cells, respectively;

FIG. 8 shows one embodiment of the present invention, where a trench capacitor has a cross section in a shape of a single bottle;

FIG. 9 shows another embodiment of the present invention, where a trench capacitor has a two-bottle cross section;

DETAILED DESCRIPTION OF THE INVENTION

The smallest space occupied by a DRAM cell which includes a transistor switch and a capacitor for charge storage, occurs when the transistor is located at the bottom of the capacitor or in the alternative on the top of the capacitor.

The first arrangement, where a stack capacitor is formed over the transistor, either requires a complex arrangement of buried bit lines and word lines, or use of true and complement bit lines together with a high permitivity material.

The second arrangement, where a trench capacitor is formed under the transistor, is incompatible with high permitivity materials because of thermal cycling constraints and the requirement of even deeper trench capacitors to maintain a sufficiently large plate area.

A 4 F-square design allows an easier and significantly less expensive path through the use of previously developed technology. Larger plate areas are permitted by placing capacitors and transistors in the same cross-section. Two structures 300, 400, of a trench capacitor and a transistor pairs of a DRAM cell, shown in FIGS. 8 and 9, are given as an example here, which are formed using hybrid resist as will be described.

Figure 1:
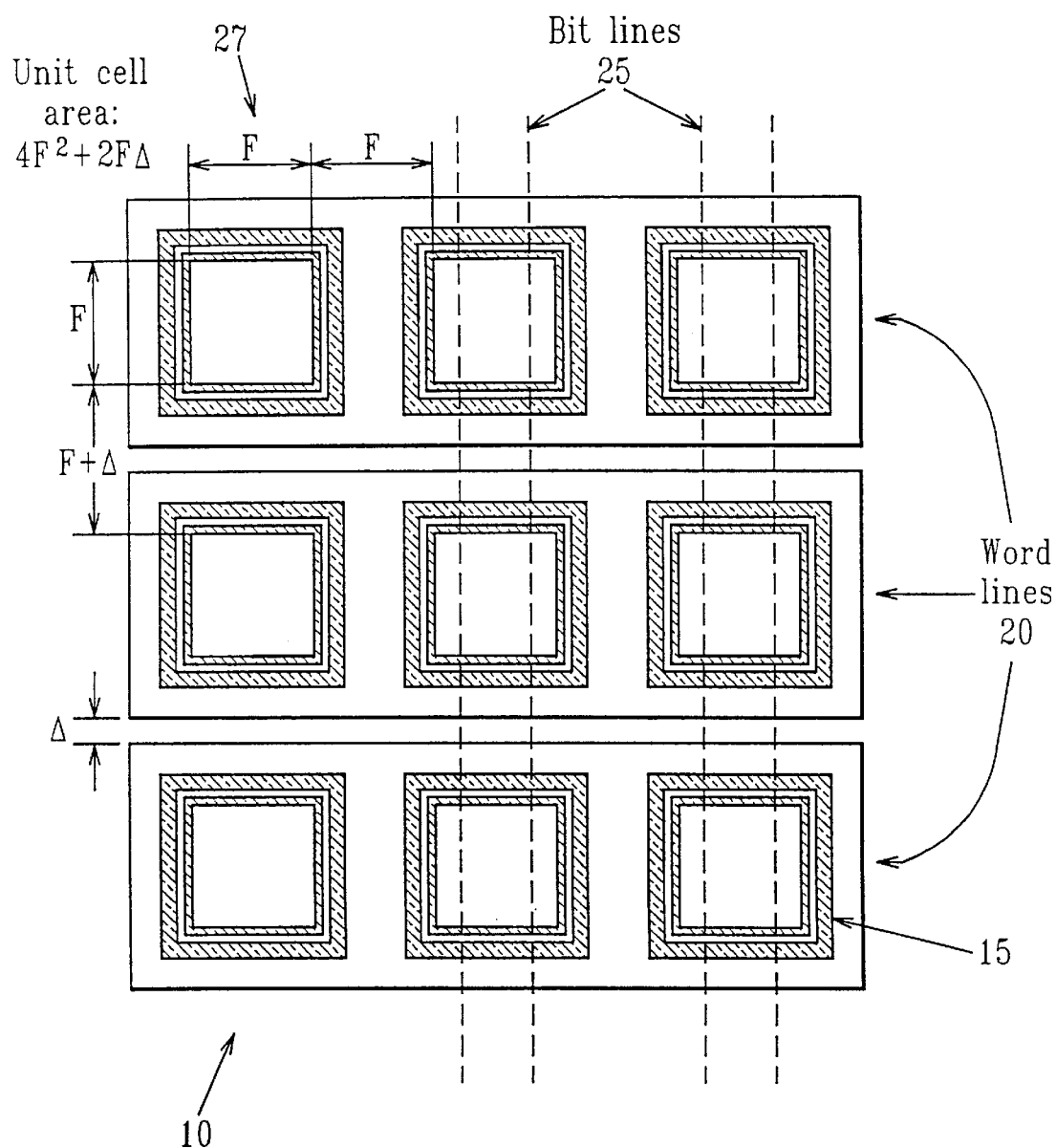
FIGS. 1–2 show top and perspective views of a conventional array of memory cells.
Figure 2:
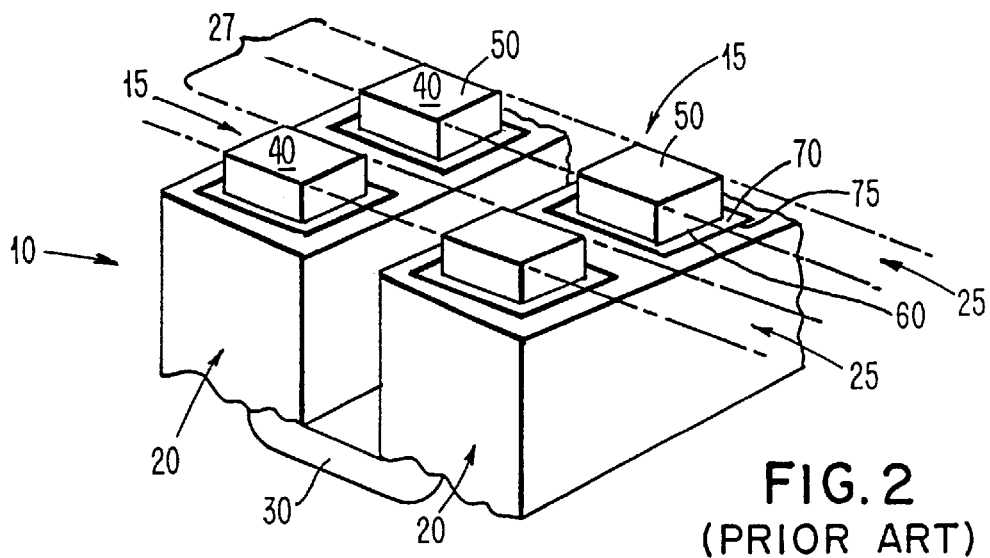
Figure 3:
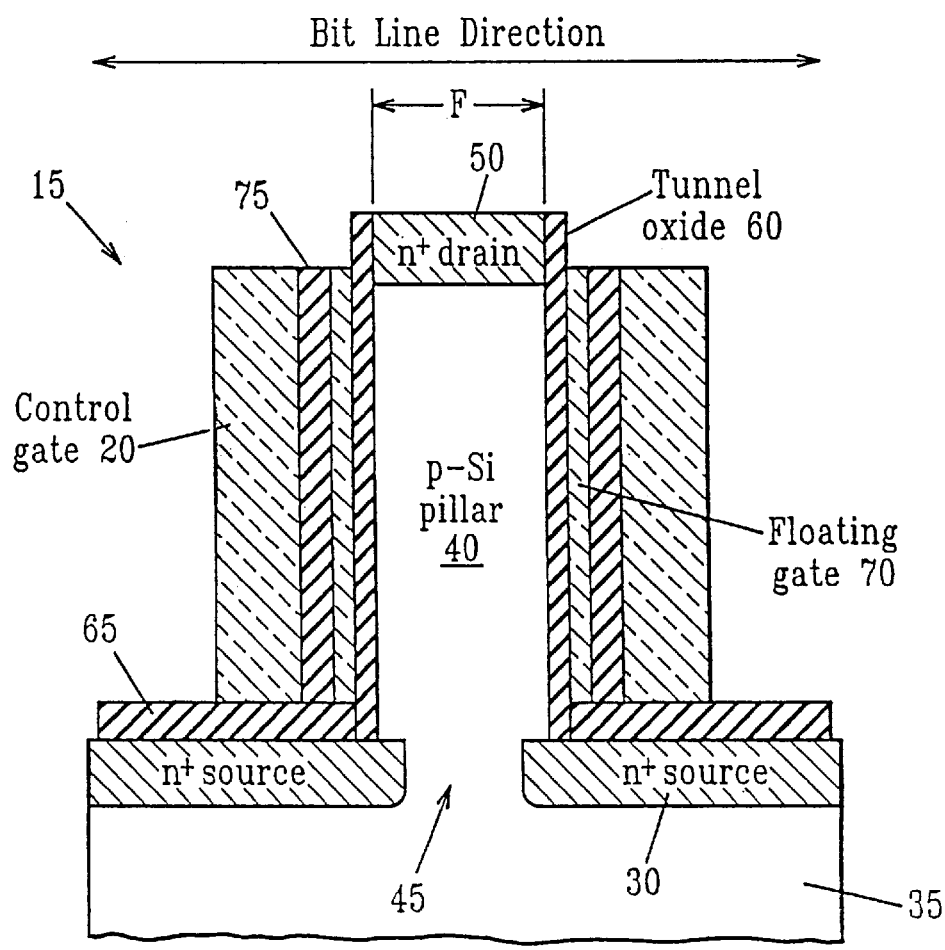
FIG. 3 shows a cross-sectional view of a one of the conventional memory cells shown in the array of FIGS. 1–2 along a bitline.
Figure 4:
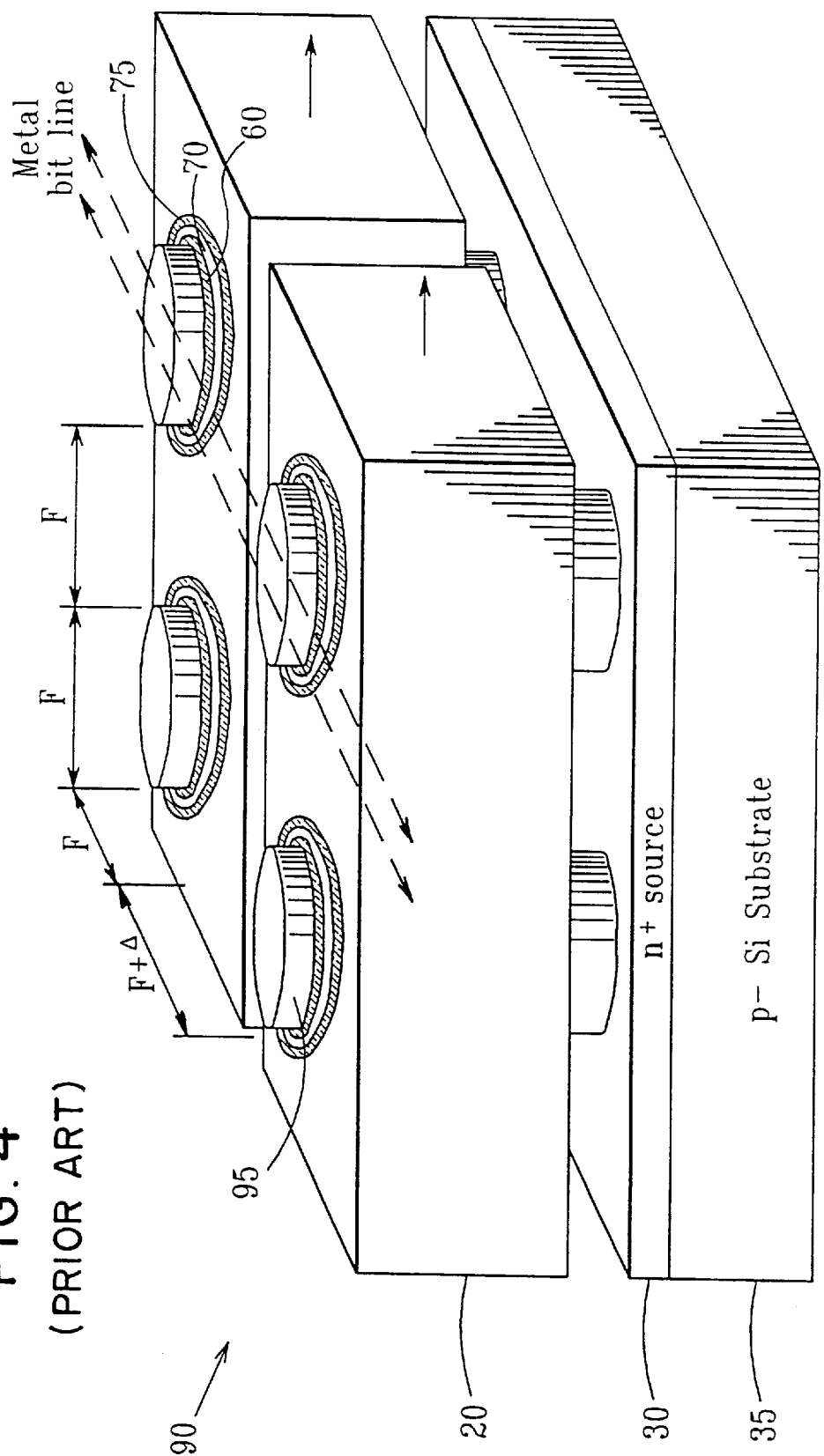
FIG. 4 shows a perspective view of another conventional array of memory cells.
Figure 10:
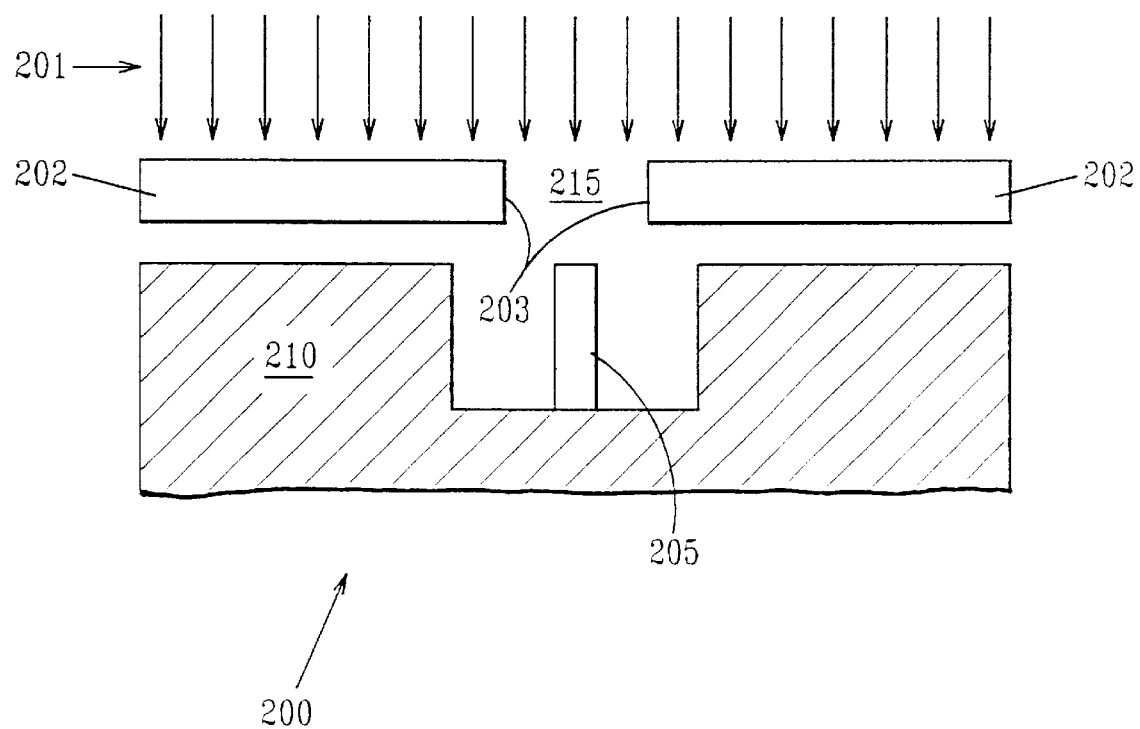
FIG. 10 shows the exposure behavior of a square spot, where hybrid resist is used on a silicon substrate during the fabrication of an array of memory cells according to the present invention.

FIG. 10 shows the exposure behavior of a square spot 215 of the hybrid resist mask 202 when the etching 201 is performed. Resist is left in the middle 205 and outside 210, while being removed at the edges 203. Thus, the edges define an open area. This allows for the opening of holes by etching on oxide/silicon or other dielectric/silicon surfaces 200. If the reverse pattern is needed, it can be achieved by using a two step etch process, where two layers of hard-masking materials (e.g., polysilicon over oxide) are used under the hybrid resist.

Using hybrid resist, a single, minimum feature size F square (or circle) on a mask can be used to pattern one or more stacked structures, such as a transistor over a capacitor. Taking advantage of the ability of hybrid resist to place features at the edges of lithographic images, either or both of these structures can be made double-walled. Hence, the process can be used to effectively double the surface area of a structure (which is useful for the capacitor) and/or make the structure self isolating (which is useful for the transistor), all without increasing the amount of planar are the structure takes up on the wafer surface.

First Structure

Figure 12:
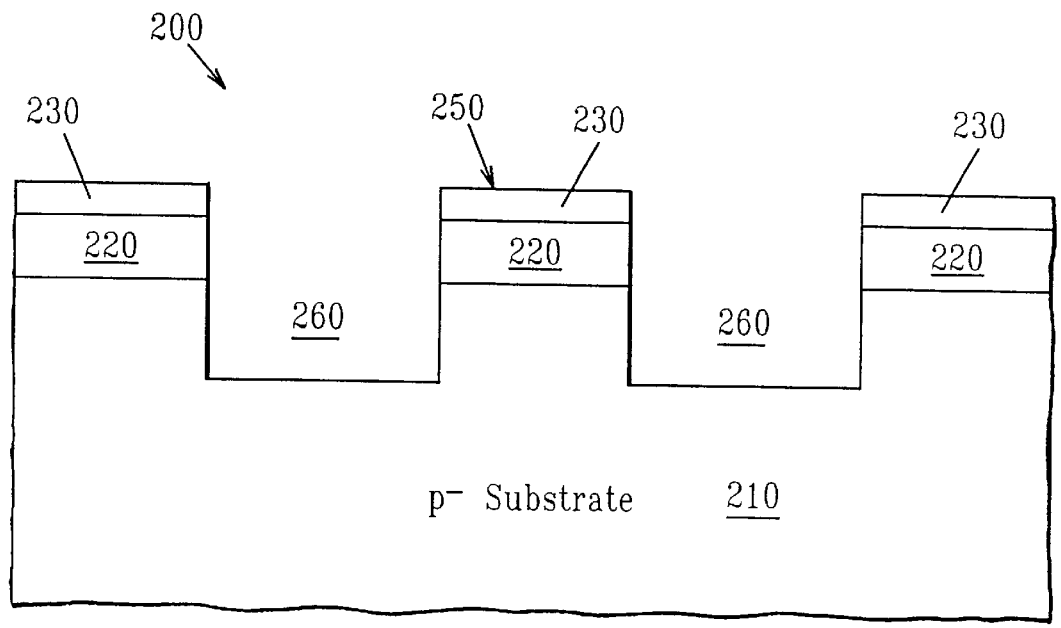
FIGS. 12–15 show a method of forming the array of memory cells shown in FIG. 11, having a vertical transistor formed on top of a capacitor according to the present invention.

The DRAM cell 300 shown in FIG. 8 includes a trench capacitor 301 having a conducting layer 310, an insulating layer 335, and dielectric spacers or collars 320. The capacitor is formed into a shape of a bottle by changing of etching conditions in order to increase the total surface area of the capacitor plate 340. The donut shape edges 303 of the square feature 304 determine the silicon pillar 250 (FIG. 12). The shape of this donut allows the etching of a deep trench followed by capping with oxide or other suitable dielectric insulating medium 302.

Figure 20:
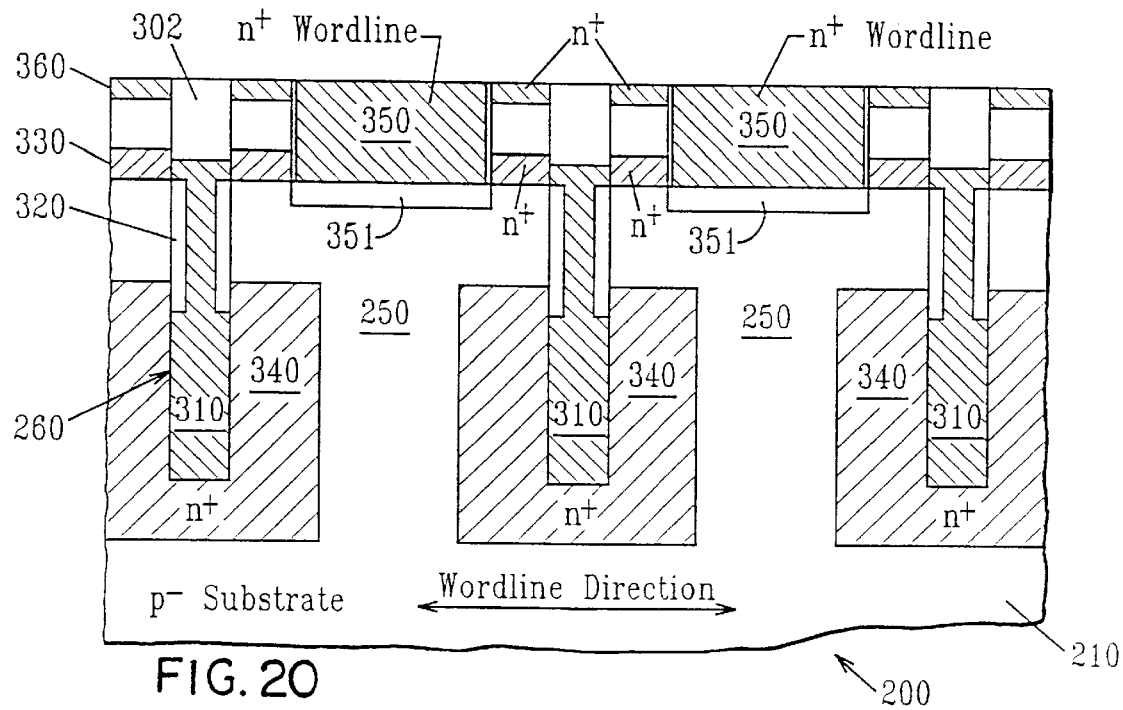
FIGS. 20 and 21 show cross sections of a memory cell array having single bottle capacitors, according to an alternative embodiment the present invention.
Figure 21:
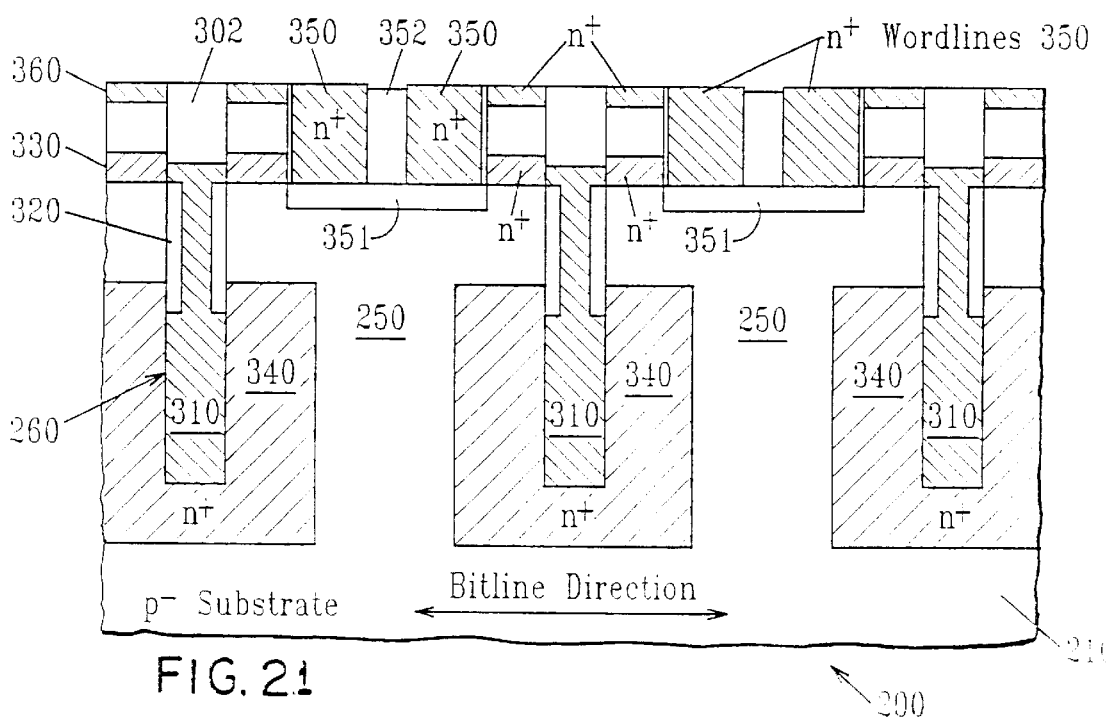

As shown in FIGS. 20, 21, filling the dielectric lined deep trench 260 with $n^+$ polysilicon to act as the storage node 310, and forming oxide collars 320 on the sidewalls of the pillar 250 to minimize leakage, as is commonly done in 256 Mbit memories, allows the strapping from the node and diffusion from it to form the source of the pillar 330. The drain 360 can be implanted. The gate 350 is placed on the outside of the pillar 250 using known techniques in vertical transistors of letting the etching and thickness of polysilicon form the connected polysilicon wordline without the use of lithography. The drain contacts and the doping of the polysilicon can be done simultaneously or separately.

The structure has several advantages.

a. Each transistor and capacitor is isolated from each other by virtue of the fabrication, one on top of the other, with a surround gate 350 and an internal capacitor storage node 340. No additional isolation is required. The charge is stored on the inside plate 310 (FIG. 8) of the capacitor. The outside is electrically grounded. The transistors are completely disconnected from each other because they are vertical.

b. The capacitor is formed within the full feature size, and because it is centered within the width of the feature the trench can be deepened in the form of a bottle resulting in a larger capacitor area as well as smaller resistance.

c. The transistor is a surround gate vertical structure. The channel length can be maintained reasonably large in order to maintain very low sub-threshold currents. The thickness of the pillar can be very small.

d. With scaling of dimensions in future generations the pillars get smaller in cross-section area, but the channel length can be maintained so the leakage currents will not suffer.

e. The structures are highly self-aligned since the shapes are built from each other. The wordlines can be formed by self-alignment through choice of spacings. The capacitor is placed in the inside recess also through self-alignment. The drain/bitline contact can be achieved through selective plug opening.

f. Both folded and open architectures can be utilized.

g. Substrate can be grounded and a $p/n^+$ structure employed.

Second Structure

The second structure 400 shown in FIG. 9 affords a larger capacitor 401 area and a more robust pillar shape, although using a bottle shape is more difficult because it then increases the feature size. However, having two surfaces for the plates, inside 436 and outside 435, is an important advantage significantly reducing the demands of charge storage in the one GBit and four GBit generations.

In addition to the advantages of self-isolation, self-alignment, low leakage, folded or open architecture, and an extension of developed technology described for the first structure above, the second structure has a. an increase in capacitance by approximately a factor of 2 even in a 4-square design;

b. a more relaxed design requirement, that allows a trade off between reasonable etch-depths and cell size;

c. at dimensions of the order of 0.3 microns for the pillar, it is possible to have a sink for holes through the substrate.

The following process flow describes the method of making of a DRAM cell shown in FIG. 9 including the high capacitance "donut" shaped deep-trench capacitor 401 having an insulating layer 435, 436, a conductive layer 410, dielectric spacers or collars 420 and a source plate 430. The deep-trench capacitor 401 is formed with a vertical FET on top of it using a nitride sidewall technique. This allows conventional lithography to be employed, however the alternate hybrid resist as described in connection with FIG. 10 could also be utilized. This capacitor 401 could also be coupled to a planar FET in a more standard DRAM architecture. This process will be discussed in connection with FIGS. 12–19.

Figure 11:
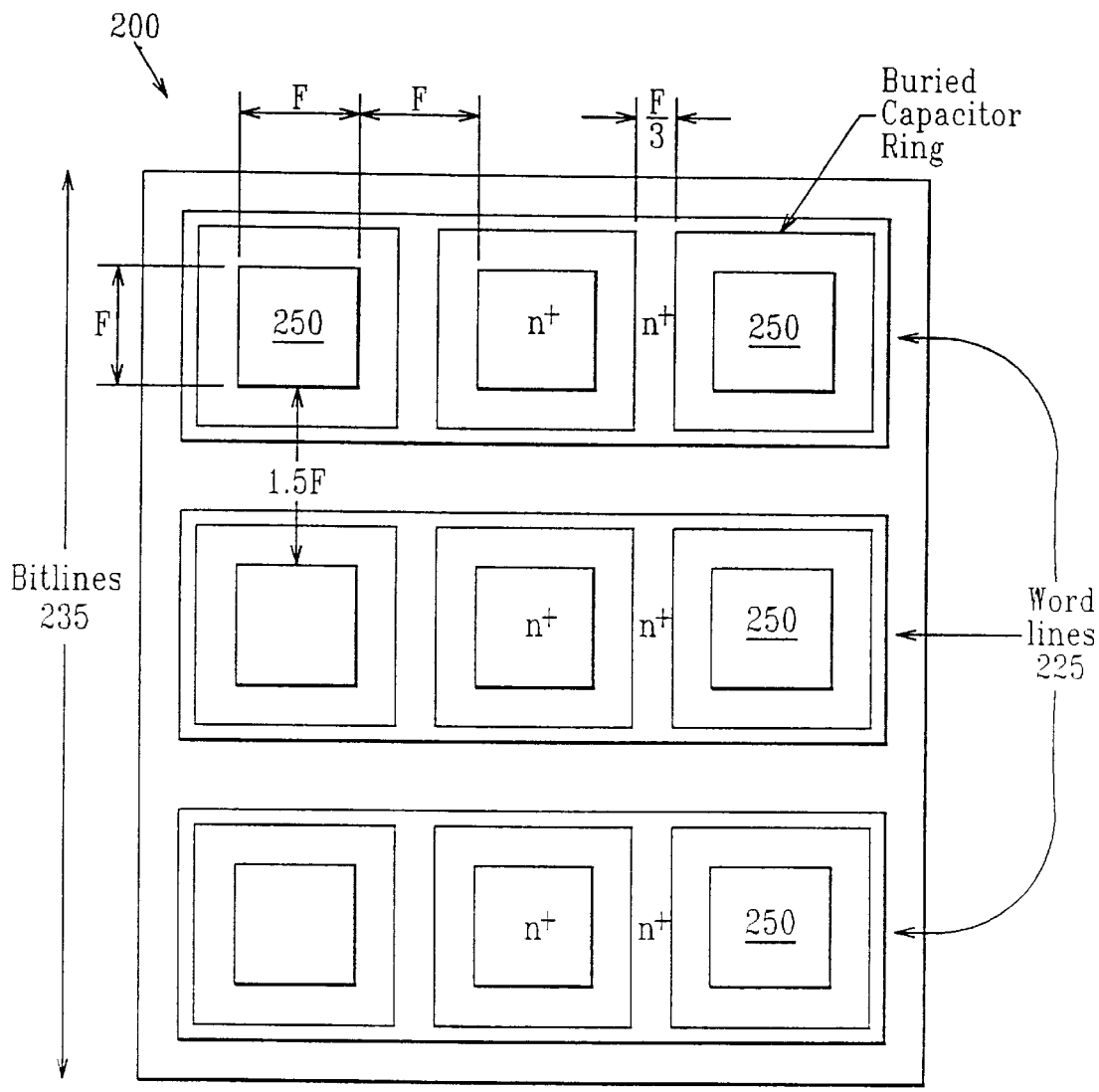
FIG. 11 shows top view of an array of memory cells where each cell has a length of F and is a distance of F from the next cell along the wordline direction, and a distance of 1.5 F from the next cell along the bitline direction according to the present invention.

As well known in the art photo resist is used to pattern an array 200 of square pillars 250 shown in FIG. 11. Each pillar 250 has a dimension of F by F.

Adjacent pillars are separated by a distance F along the wordline 225, and a distance 1.5 F along the bitline 235.

FIG. 12 shows the result of a step where a silicon wafer 210 with a thick layer of oxide 220 and a top thin mask layer of nitride 230 formed over it is etched using a photo resist mask. The depth of the silicon etch is deep enough to accommodate the desired channel length of FET including source and drain depths with appropriate process tolerances. At the conclusion of the process the photo resist is stripped.

Figure 13:
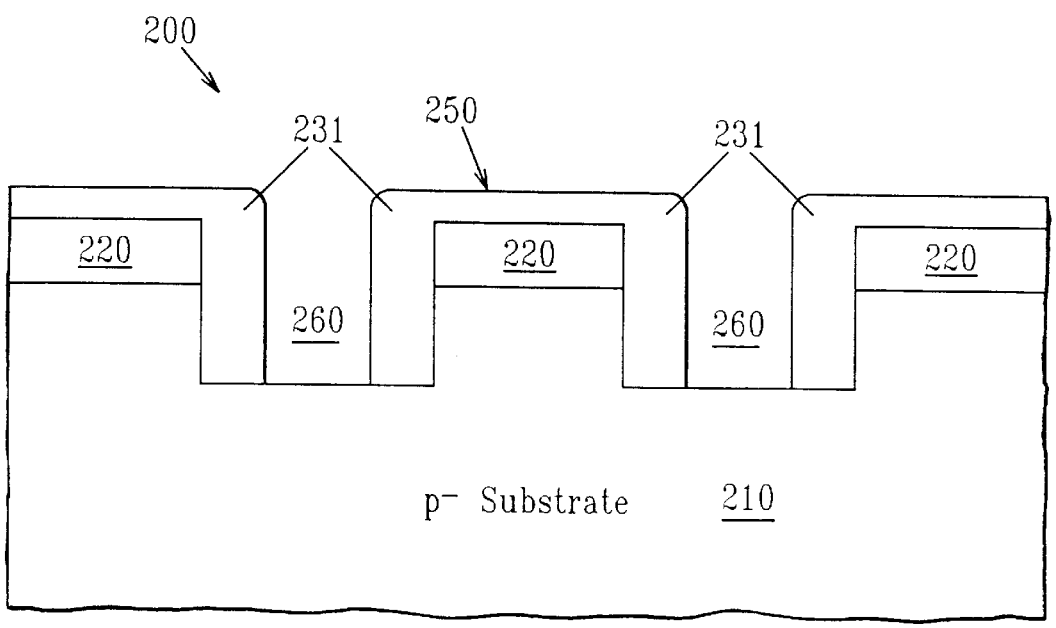

As shown in FIG. 13 a layer of nitride 231 is formed across the entire wafer 200 with a thickness approximately equal to F/3. The nitride 231 is then removed from the bottom of the trenches 260 using anisotropic reactive ion etching (RIE) for example. This exposes the silicon wafer 210 between the nitride sidewall lines 231 leaving the nitride 231 lining the sidewalls.

Figure 14:
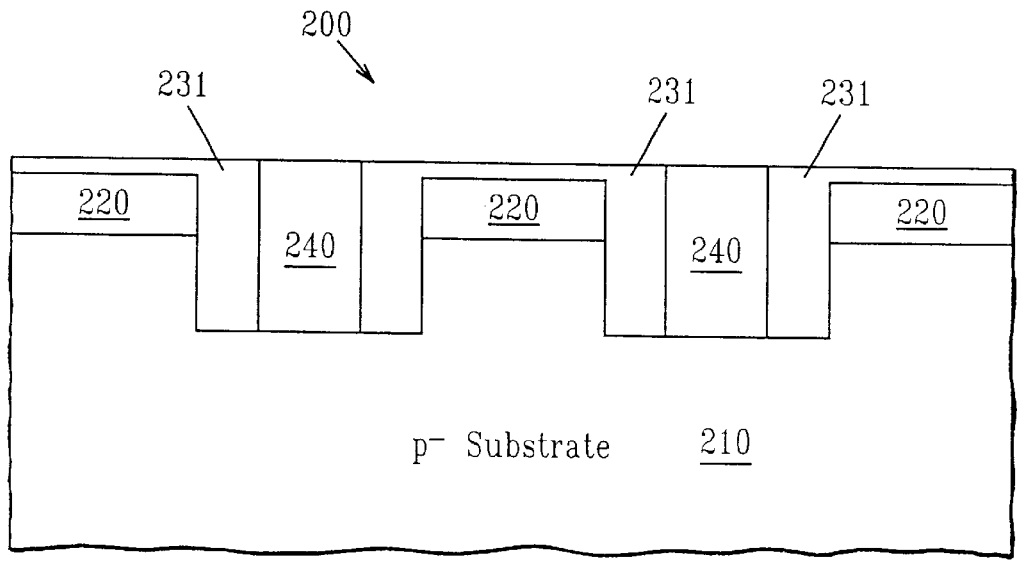
Figure 15:
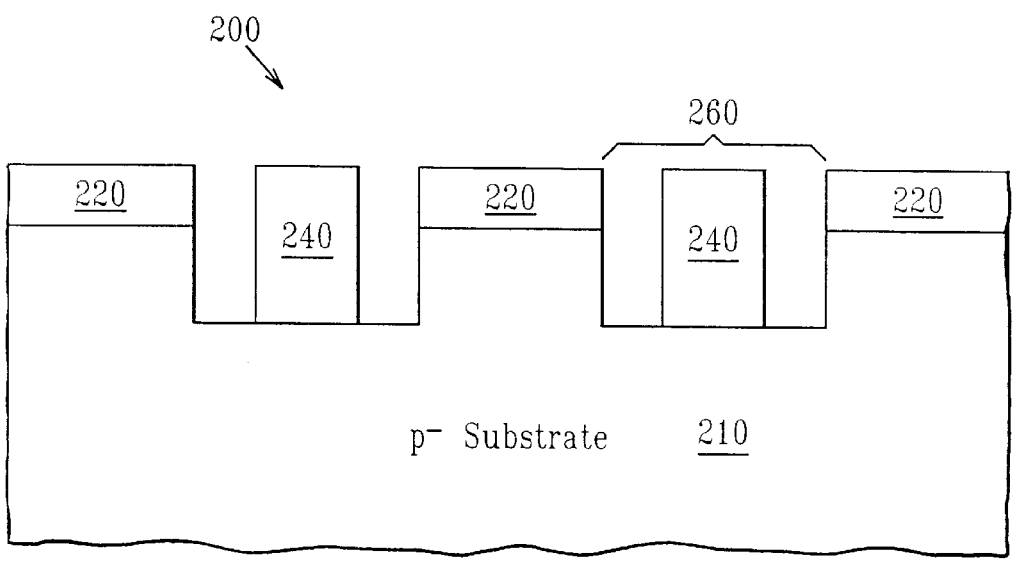

As shown in FIG. 14 a thick oxide layer 240 is then formed over the whole wafer 200. Chemical polishing, for example, may be used to planarize this oxide layer with the nitride sidewalls and the nitride layer remaining on top of the pillars. After the remaining nitride is removed, oxide fillers 240 (FIG. 15) are remaining. Phosphoric acid may be used to remove the nitride.

Figure 16:
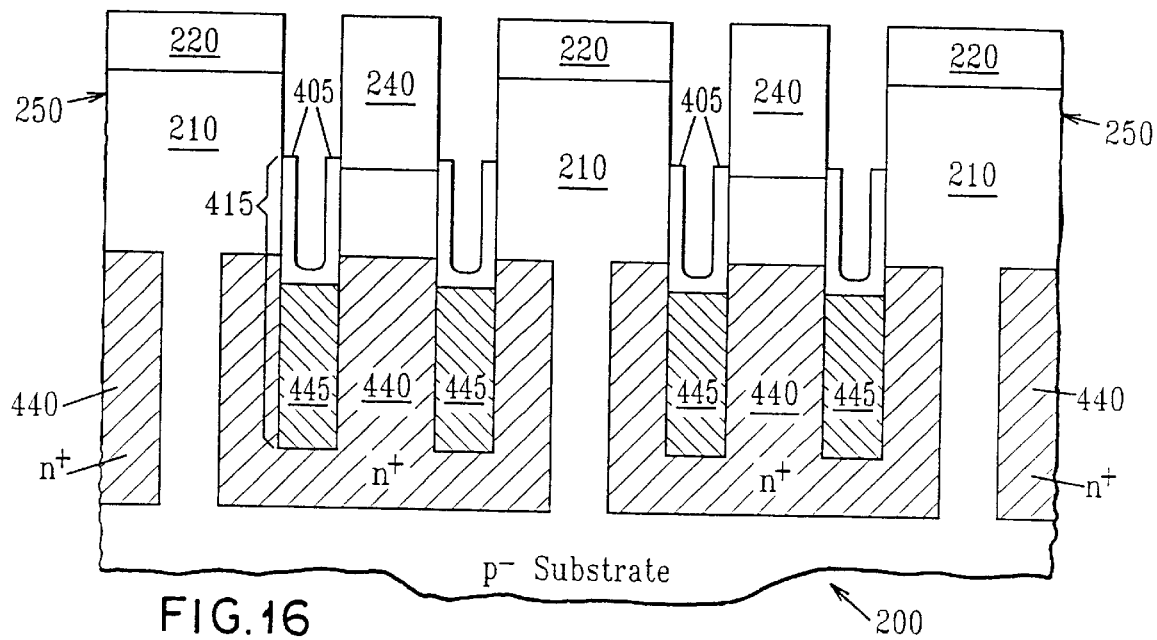
FIGS. 16 and 17 show a method of forming a capacitor plate electrode, a capacitor storage electrode, and a transistor drain and gate regions according to the present invention.

Using an oxide layer 220, which was formed over the silicon wafer 210 and the oxide filler 240 formed in the trench 260, as a mask, deep trenches 415, shown in FIG. 16, are etched. The depth of the trenches 415 is determined by the amount of capacitance required. A dopant source, e.g. arsenic-doped glass, is formed inside the trenches 415. It is used to out diffuse the $n^+$ buried plate 440. The dopant source is removed and the capacitor dielectric 435, 436 (FIG. 9) is formed, e.g. grown. FIG. 16 shows a polysilicon layer 445 recessed to the desired height, followed by oxide layer 405 also recessed to the desired height, are then formed in the trenches 415.

Figure 17:
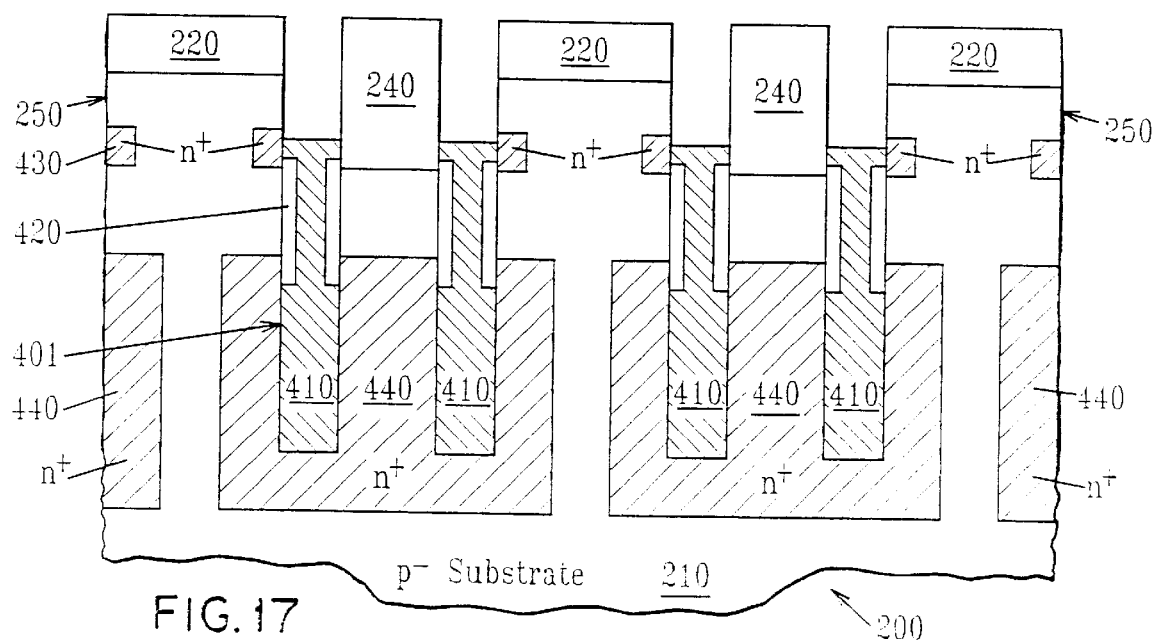

The oxide layer 405 is etched through to expose polysilicon 445 thereby creating a thick oxide collar or spacer 420 as shown in FIG. 17. Additional polysilicon is added to complete the capacitor conducting layer 410. A source region 430 is formed at the same time in the area of the pillar 250 aligned with the top of trench capacitor 401 by out diffusing from the capacitor conducting layer 410.

Figure 18:
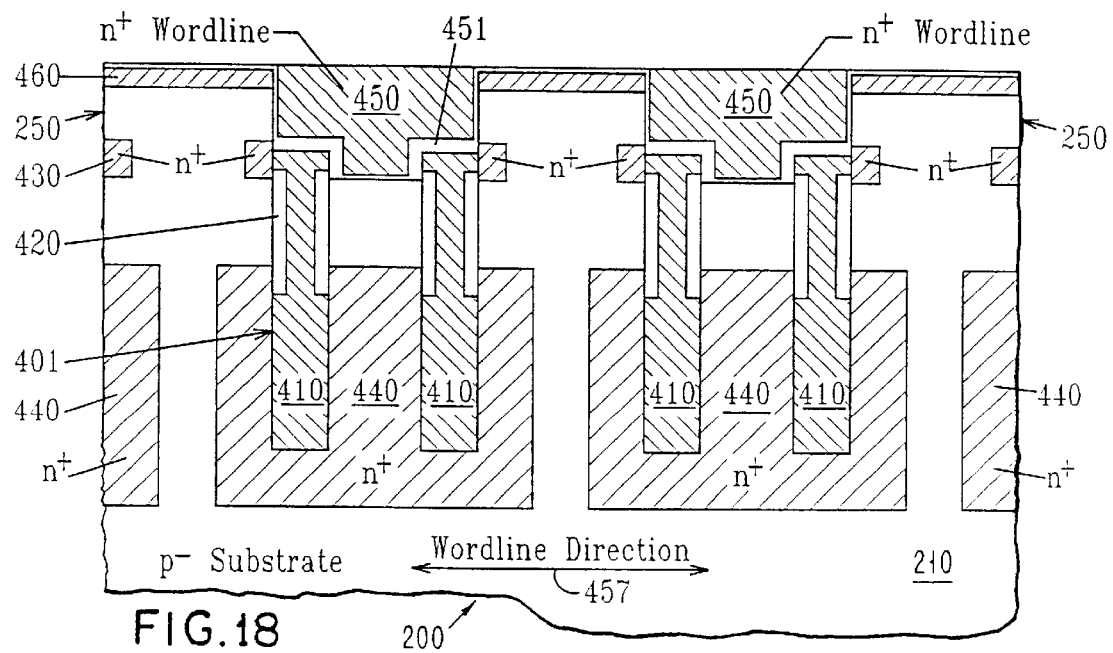
FIGS. 18 and 19 show cross sections of a memory cell array having two bottle capacitors, according to the present invention.
Figure 19:
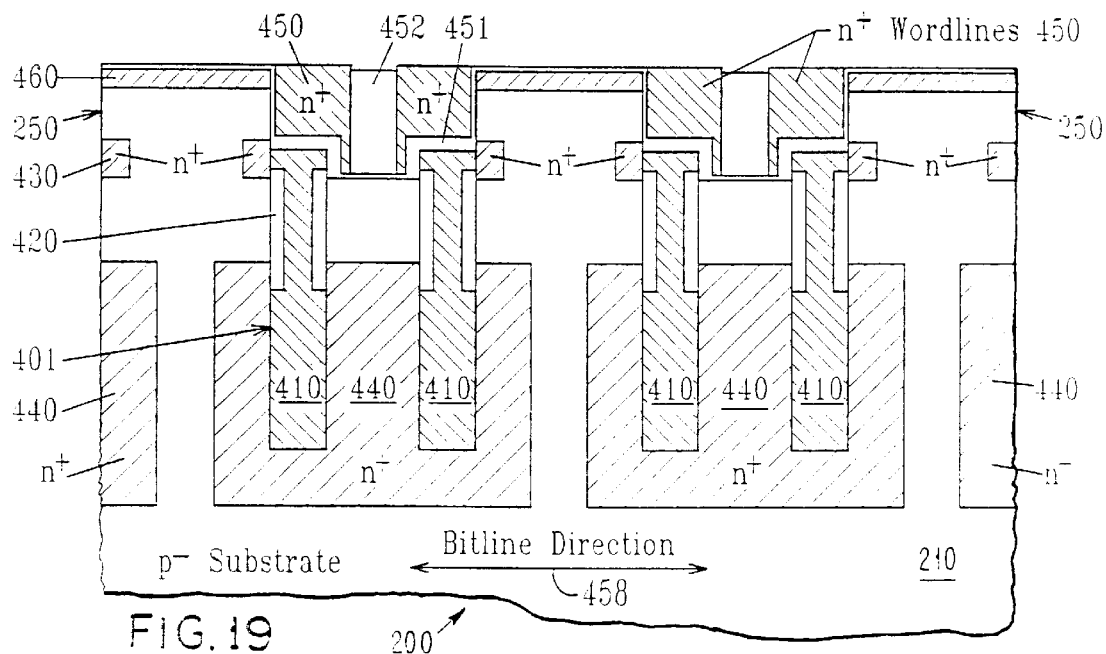

The oxide layer 220 and the oxide filler 240 are stripped from the wafer 200, and, as FIGS. 18 and 19 show, a thick oxide layer 451, referred to as a gate oxide, is formed to isolate the polysilicon 410 of the trench capacitor 401 from the gate polysilicon 450, which is to be formed. The gate oxide 451 is formed to surround the pillars 250 and the gate polysilicon 450 is formed, e.g. deposited to a thickness of F/2 over the whole wafer 200 completely filling in the space between the pillars 250 in the wordline direction 457 (FIG. 18).

As shown in FIG. 19, a space 452 between the pillars 250 in the bitline direction 458 is not completely filled in due to the fact that in bitline direction the distance between the pillars is 1.5 F. The space 452 has a width of 0.5 F. The anisotropic etch procedure is used again to remove the polysilicon from planar surfaces while leaving polysilicon on sidewalls around the pillars, leaving adjacent pillars connected in the wordline direction 457 (FIG. 18) and separated in the bitline direction 458.

Having thus described our invention, what we claim as new, and desire to secure by Letters Patent is:

1. A DRAM device comprising
   a substrate, said substrate including an array of cells having trenches that are isolated by pillars that extend upward, said pillars having a drain region therein, and said pillars and trenches being arranged in rows and columns;
   a trench capacitor formed in a bottom region of each trench, said trench capacitor comprising at least an insulating layer lining said bottom region of said trench, and a conductive material formed in said trench on said insulating layer; and
   a transistor formed in an upper region of said trenches, said transistor being formed on top of a collar region, said collar region separating said upper and bottom regions of said trench, and a source region about said pillars adjacent to said transistor.

2. The DRAM device of claim 1 further comprising plate electrodes formed within said substrate about said bottom region of said trench.

3. The DRAM device of claim 2 wherein said plate electrodes of adjacent trenches are interconnected to form a common plate electrode.

4. The DRAM device of claim 1 wherein said transistor includes a gate region, a dielectric layer about said gate region and gate electrodes about said dielectric layer.

5. The DRAM device of claim 4 wherein said gate regions along said rows are continuous to form wordlines of said cells.

6. The DRAM device of claim 4 wherein said gate regions are common along pillars arranged in said rows.

7. A DRAM device comprising
   a substrate, said substrate including an array of cells having trenches that are isolated by pillars that extend upward, said pillars having a drain region therein, and said pillars and trenches being arranged in rows and columns, wherein each trench includes two closely spaced areas for forming trench capacitors therein, said closely spaced areas being separated by a recessed central trench wall;
   trench capacitors formed in a bottom region of each closely spaced area, said trench capacitors comprising at least an insulating layer lining said bottom region of said trench, and a conductive material formed in said trench on said insulating layer; and
   a transistor formed in said trench above said recessed central trench wall, wherein said capacitors in each trench are coupled by said transistor, and a source region about said pillars adjacent to said transistor.

8. The DRAM device of claim 7 further comprising plate electrodes formed within said substrate about said bottom region of said trench.

9. The DRAM device of claim 8 wherein said plate electrodes of adjacent trenches are interconnected to form a common plate electrode.

10. The DRAM device of claim 7 wherein said transistor includes a gate region, a dielectric layer about said gate region and gate electrodes about said dielectric layer.

11. The DRAM device of claim 10 wherein said gate regions along said rows are continuous to form wordlines of said cells.

12. The DRAM device of claim 10 wherein said gate regions are common along pillars arranged in said rows.

* * * * *